(12) United States Patent
Conte et al.

(10) Patent No.: US 6,320,808 B1
(45) Date of Patent: Nov. 20, 2001

(54) MEMORY READ AMPLIFIER CIRCUIT WITH HIGH CURRENT LEVEL DISCRIMINATION CAPACITY

(75) Inventors: Antonino Conte, Tremestieri Etneo; Maurizio Gaibotti, Cesano Maderno, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/686,632

(22) Filed: Oct. 11, 2000

(30) Foreign Application Priority Data

Oct. 11, 1999 (IT) ............................................. MI99A2119

(51) Int. Cl.$^7$ ...................................................... G11C 7/00
(52) U.S. Cl. ................. 365/205; 365/185.2; 365/185.21; 365/185.25
(58) Field of Search ................................ 365/205, 185.2, 365/185.21, 185.25, 203, 202, 210, 207, 208, 195, 196

(56) References Cited

U.S. PATENT DOCUMENTS

| | | | |
|---|---|---|---|
| 5,563,826 | * 10/1996 | Pascucci et al. | ................. 365/185.21 |
| 6,191,979 | * 2/2001 | Uekubo | ............................ 365/185.25 |
| 6,205,068 | * 3/2001 | Yoom | .................................... 365/203 |

FOREIGN PATENT DOCUMENTS

405152874A * 6/1993 (JP) .................................. G11C/5/09

* cited by examiner

*Primary Examiner*—David Nelms
*Assistant Examiner*—David Lam
(74) *Attorney, Agent, or Firm*—Theodore E. Galanthay; Allen, Dyer, Doppelt, Milbrath & Gilchrist, P.A.

(57) ABSTRACT

A memory read amplifier circuit includes at least one memory cell to be read and a bit line connected thereto, a first pre-charge amplifier circuit connected to the bit line. A first cascode circuit is connected between a supply voltage and the memory cell for providing a first current to the memory cell. The memory read amplifier circuit also includes at least one reference memory cell and a reference bit line connected thereto, and a second pre-charge amplifier circuit connected to the reference bit line. A second cascode circuit is connected between the supply voltage and the reference memory cell for providing a second current to the reference memory cell. A differential comparator circuit having a first input is connected to the control terminal of the first cascode circuit for receiving a first voltage based upon the first current, and a second input connected to the control terminal of the second cascode circuit for receiving a second voltage based upon the second current. The differential comparator circuit compares the first and second voltages for providing a logic value relegates to a state of the memory cell to be read.

38 Claims, 2 Drawing Sheets

MEMORY READ AMPLIFIER CIRCUIT WITH HIGH CURRENT LEVEL DISCRIMINATION CAPACITY

FIELD OF THE INVENTION

The present invention relates to a memory read amplifier circuit with high current level discrimination capacity. More particularly, the memory device is a EEPROM capable of discriminating very low current levels yet maintaining good read speed characteristics.

BACKGROUND OF THE INVENTION

In memory devices, such as EEPROMS, a unit of information is stored in a floating-gate transistor. Depending on the logic state to be stored (i.e., a logic 0 or a logic 1), a positive or negative electrical charge is trapped in the floating gate of the transistor, thus altering its threshold. If no electrical charges are stored in the floating gate, the memory cell is termed virgin, otherwise it is deleted or written.

The correspondence between the deleted or written logic states depends on conventions which can change from product to product. The logic state of the cell is recognized on the basis of the current that flows across it in very specific bias conditions. If a negative charge is trapped in the floating gate of the transistor, the threshold of the cell is higher than in a virgin cell. Otherwise, the threshold is lower than in a virgin cell.

In most cases, the information is obtained from a comparison between the current of the cell and the current of an appropriate reference, which can be absolute (a constant current) or derived from a virgin cell which is biased in exactly the same manner as the cell whose state is to be sensed. In conventional read amplifier circuits this comparison is performed by using current/voltage (I/V) converters. These converters are formed by current mirrors using P-channel transistors.

Read amplifier circuits are therefore often based on a current mirror between two branches, as shown in FIG. 1. This figure shows how the drain terminals of the reference memory cells 1 and 2 are connected to a bit line and a decoder selects one of them. One circuit is connected to the bit line of the selected cell and at the same time a similar circuit is connected to the virgin cell located external the cell array, or to the reference memory cells depending on the situation.

The resulting two different currents are usually mirrored on PMOS transistors and are converted into voltages by a current/voltage converter which is formed using PMOS transistors. The resulting voltages, designated in FIG. 1 by Vref and Vcell, are applied to the inputs of a differential comparator 3. The differential comparator 3 compares the two voltages and provides at an output a logic value related to the state of the memory cell being considered.

The approach shown in FIG. 1 can have limitations when the supply voltage Vdd drops to approximately 1.8 V due to the presence of the diode-connected PMOS transistor. The speed of the read amplifier circuit of FIG. 1 is further greatly influenced by the reference current. When the reference current tends to become very low the amplifier circuit accordingly tends to become very slow.

Therefore, a drawback of conventional read amplifier circuits is that they are unable to discriminate very low currents while maintaining good speed and functionality characteristics even at supply voltages below 2 V. Moreover, conventional read amplifier circuits are unable to operate over a wide range of supply voltages. This characteristic would be highly desirable for applications in so-called smart cards, for example.

SUMMARY OF THE INVENTION

In view of the foregoing background, an object of the present invention is to provide a memory read amplifier circuit that discriminates very low current levels while maintaining good performance in terms of speed.

Another object of the present invention is to provide a memory read amplifier circuit that operates over a wide range of supply voltages.

Yet another object of the present invention is to provide a memory read amplifier circuit that ensures biasing of the controlled bit lines in a variety of temperature and supply conditions.

Another object of the present invention is to provide a memory read amplifier circuit having good noise rejection.

A further object of the present invention is to provide a memory read amplifier circuit having a differential comparator with very fast output switching times.

Yet a further object of the present invention is to provide a memory read amplifier circuit that is highly reliable, relatively easy to manufacture and at competitive costs.

These objects, advantages and features which will become more apparent hereinafter are achieved by a memory read amplifier circuit comprising a first pre-charge amplifier circuit connected to a bit line which is connected to a memory cell to be read, and a second pre-charge amplifier circuit connected to a reference bit line which is connected to a reference memory cell.

The memory read amplifier circuit further includes a differential comparator which compares a first voltage signal and a second voltage signal obtained from respective current signals related to the memory cell to be read and to the reference memory cell. The first and second pre-charge amplifier circuits are respectively connected to the gate terminal of a first cascode circuit and of a second cascode circuit, which are in turn connected between a supply voltage and the memory cell to be read and the reference memory cell.

The gate terminals of the first and second cascode circuits are connected to inputs of the differential comparator. The gate voltage of the first and second cascode circuits are a function of the current signals of the memory cell to be read and of the reference memory cell, respectively.

BRIEF DESCRIPTION OF THE DRAWINGS

Further characteristics and advantages of the present invention will become more apparent from the following detailed description of a preferred but not an exclusive embodiment of the read amplifier circuit according to the present invention, illustrated only by way of a non-limitative example in the accompanying drawings, wherein.

DETAILED DESCRIPTION OF THE PREFERRED EMBODIMENTS

Figure 3:
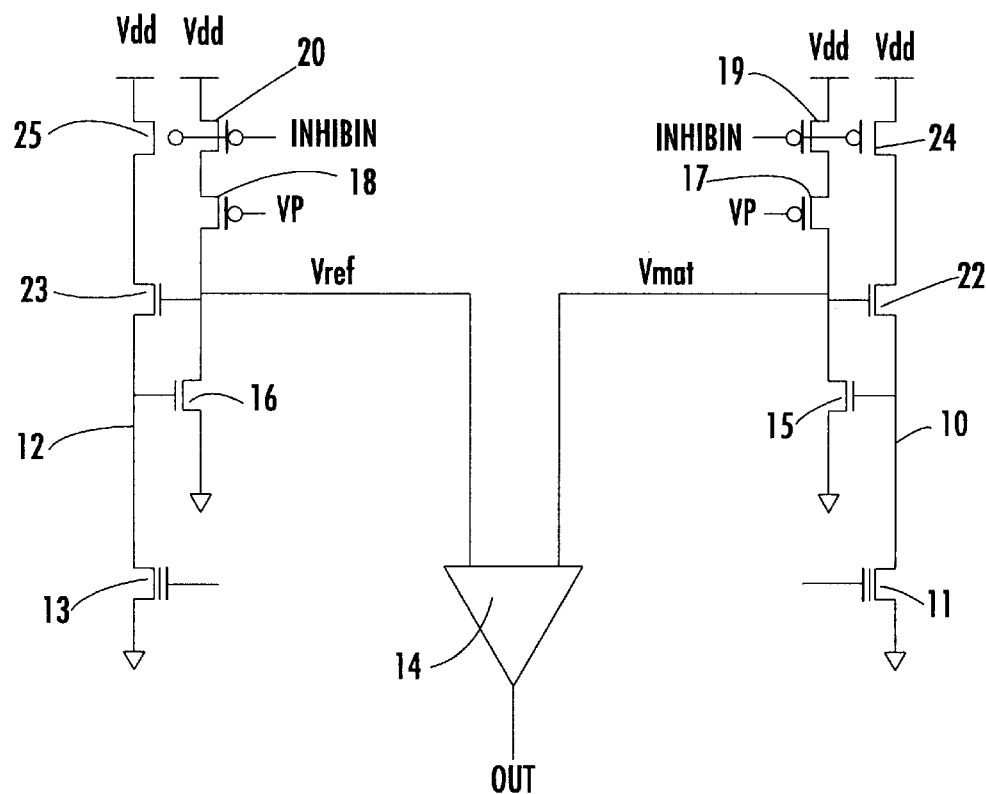
FIG. 3 is a circuit diagram of a read amplifier circuit according to the present invention.

With reference to the above figures, and initially to FIG. 3, the read amplifier circuit according to the invention comprises a first pre-charge amplifier circuit. The first pre-charge amplifier circuit is connected to a bit line 10 to which a memory cell to be read 11 is connected. A second pre-charge amplifier circuit is instead connected to a reference bit line 12 which is connected to a reference memory cell 13.

A differential comparator 14 compares a first voltage signal Vmat and a second voltage signal Vref obtained from respective current signals related to memory cells 11 and 13. The first and second pre-charge amplifier circuits are respectively formed by an N-channel MOS transistor 15, 16 biased by a P-channel MOS transistor 17, 18.

The respective MOS transistors 17 and 18 of the first and second pre-charge circuits are biased by a voltage VP which is fed to their gate terminals. The pre-charge circuit further comprises an additional P-channel MOS transistor 19, 20 which is respectively connected to the source terminal of the transistor 17, 18 by its drain terminal and to the supply voltage Vdd by its source terminal.

Signals INHIBN for inhibiting the corresponding pre-charge circuits are fed to the gate terminals of the MOS transistors 19 and 20. The first pre-charge amplifier circuit and the second pre-charge amplifier circuit are respectively connected to the gate terminals of a first cascode circuit and a second cascode circuit, which are in turn connected between the supply voltage Vdd and the memory cells 11 and 13.

The cascode circuit related to the bit line 10 comprises a transistor 22 of the native type, which is connected by its gate terminal to the common point between the drain terminals of transistors 15 and 17. The transistor 22 is connected by its drain terminal to the drain terminal of the P-channel MOS transistor 24. The P-channel MOS transistor 24 is connected by its gate terminal to the gate terminal of the transistor 19, and by its source terminal to the supply voltage Vdd. The source terminal of the native transistor 22 is instead connected to the memory cell and to the gate terminal of the MOS transistor 15.

Likewise, the cascode circuit of the reference bit line 12 comprises a native MOS transistor 23, which is connected by its drain terminal to the drain terminal of the P-channel MOS transistor 25. The P-channel MOS transistor 25 is in turn connected by its gate terminal to the gate terminal of the MOS transistor 20, and by its source terminal to the supply voltage Vdd.

The gate terminal of the transistor 23 is connected to the common point between the drain terminals of the transistors 16 and 18, while its source terminal is connected to the reference memory cell 13 and to the gate terminal of the N-channel MOS transistor 16. The pre-charge amplifier circuit also acts as a current/voltage converter, and therefore, the read amplifier circuit according to the invention does not use current mirrors formed by PMOS transistors.

The current is supplied to the memory cell by the cascode circuit which is directly connected to the power supply. The cascode circuits (transistors 22 and 23) are dimensioned with a channel length which is sufficient to ensure a voltage variation of at least approximately one hundred millivolts between the gate terminal and the source terminal for a preset minimum variation of the current with respect to the reference current. The latter is the minimum current that the circuit is capable of discriminating.

The first pre-charge amplifier circuit and the second pre-charge amplifier circuit have a high gain and allow setting on the respective bit lines 10, 12 a voltage which is substantially independent of the current supplied to the memory cell. Therefore, if the cascode transistors 22, 23 are sufficiently resistive, they will adapt their gate voltage to an appropriate value, i.e., such as to provide the respective memory cells 11, 13 with the current it requires.

The respective gate voltages with respect to ground for the transistors 22 and 23 is therefore a function of the current of the memory cells 11 and 13.

This current/voltage characteristic is used as a current-voltage conversion factor. By connecting the gate voltages of the transistors 22, 23 to one of the inputs of the differential comparator 14, while the other input is connected to a circuit which is similar to the preceding one and on which the current used as reference is made to flow, the following results are obtained.

First, the current of the memory cell 11 is higher than the current of the reference memory cell 13. In this case, the voltage on the gate terminal of the transistor 22 (Vmat) used as pre-charge circuit for the bit line 10 is higher than the voltage of the reference branch, and therefore, the comparator 14 provides a logic value 1 at the output.

Second, the current of the memory cell 11 is lower than the current of the reference cell. In this case, the voltage on the gate terminal of the transistor 22 used as the pre-charge circuit for the bit line 10 is lower than the voltage of the reference branch, and therefore, the comparator 14 provides a logic value 0 at the output.

The signal INHIBN enables read starting and the pre-charge circuit starts to pre-charge the bit line, and therefore, the node designated by Vmat tends to approach the node designated by Vref. This node in turn tends to reach the value set by the reference current. Switching occurs when the two nodes cross, i.e., when the current of the memory cell 11 is lower than the current of the reference memory cell 13.

The above-described read amplifier circuit performs pre-charging and switching in very short times even if the reference current is very low. This is possible because the information that is used to compare the two currents arrives directly from the gate terminal of the transistor 22, 23 used for pre-charging, and therefore, does not require further conversion.

Since all the reference current is used for the comparison, the minimum current that the circuit is capable of detecting is mainly limited by the offset of the comparator 14, which therefore must be designed with particular care. Since the architecture of the circuit is of the differential type, a good noise rejection behavior with respect to ground and power supply noise is accordingly obtained.

The operating range of the read circuit is wide because the pre-charge circuits are biased at a constant current by the signal VP, and therefore, independently of the supply voltage Vdd. Both the lower limit and the upper limit of the operating range of the circuit according to the invention are a function of the technology used.

Control of the bias of the bit lines is ensured by the fact that biasing is performed by the transistors 15, 16 which are biased at a constant current. The bias currents and the dimensions of the transistors 15, 16 are chosen so that the switching point of the transistor is temperature compensated. Dependency on the supply voltage is ensured by the constant current bias.

Figure 2:
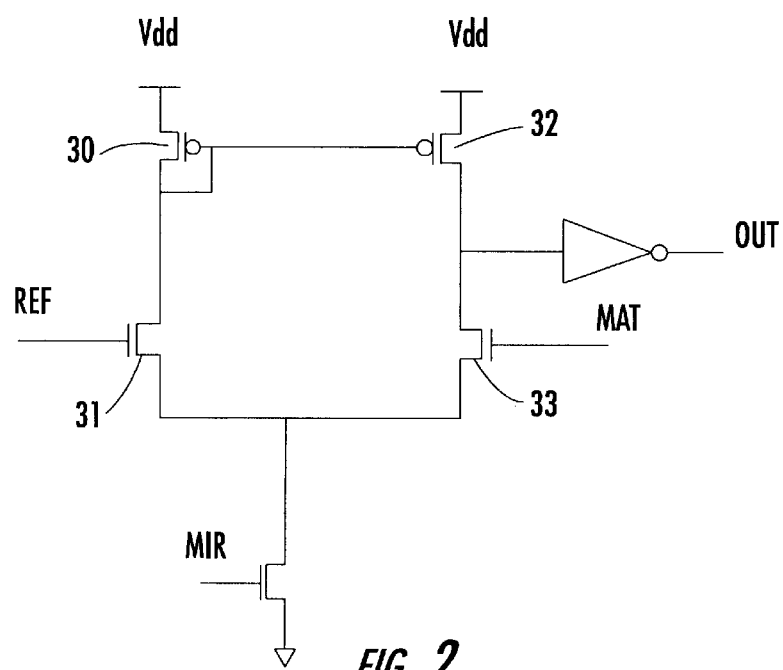
FIG. 2 is a circuit diagram of a conventional differential comparator used in memory read amplifier circuits according to the prior art.

Moreover, the read amplifier circuit according to the invention has an appropriate comparator. FIG. 2 illustrates the conventional differential comparator based on a differential pair designated by the reference numerals 30, 31 and 32, 33, which are followed by an output inverter stage 34.

Figure 1:
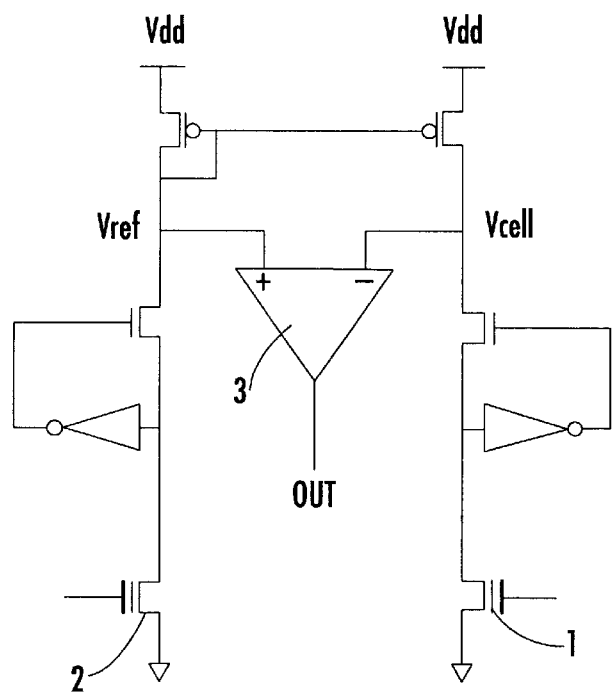
FIG. 1 is a circuit diagram of a conventional memory amplifier circuit according to the prior art.

The inputs of the differential pair are the signals REF and MAT, which originate respectively from the reference bit line 12 and from the bit line 10 of the memory cell to be read. The output signal of the comparator, which in FIG. 2 is generally designated by the reference numeral 3 as shown in FIG. 1, starts from the preset condition at the beginning of each read cycle and switches only if the signal MAT crosses the signal REF.

Once these two signals cross, the speed with which the comparator is able to switch is limited by its slew rate and by the power supply voltage Vdd since the switching point of the inverter 34 is a function of the power supply voltage. This can entail switching times which heavily affect the overall access time of the memory.

Figure 4:
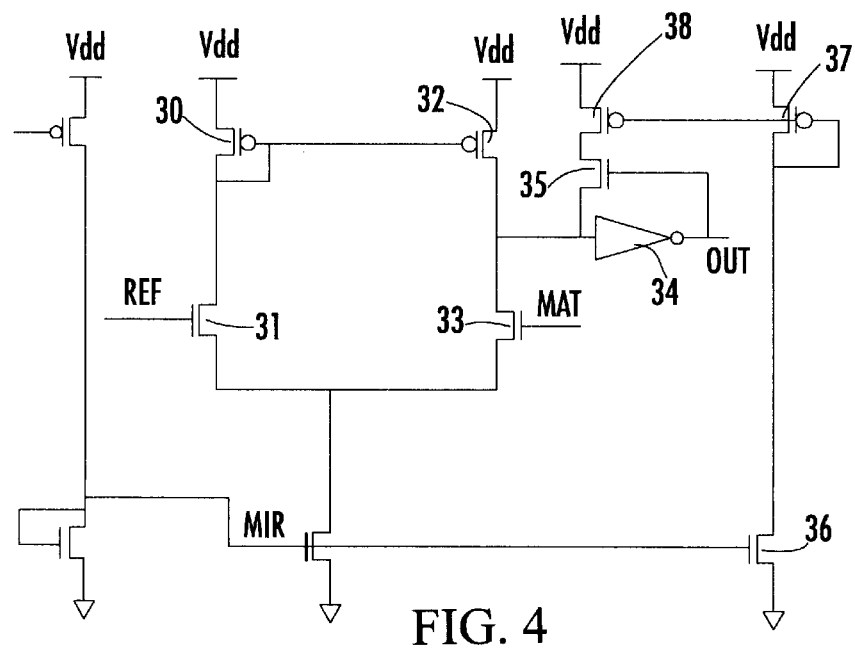
FIG. 4 is a circuit diagram of a differential comparator used in the read amplifier circuit according to the present invention.

Accordingly, the comparator of the read circuit according to the invention, shown in FIG. 4, is formed by a differential pair designated by the same reference numerals as in FIG. 2. An inverter output stage 34 is provided with feedback using an N-channel transistor 35 to pre-charge the output of the differential pair to a value which is proximate to the switching threshold of the inverter 34.

When the comparator is switched on, the node MAT is pre-charged to the supply voltage Vdd, while the node REF is pre-charged to the ground voltage. Accordingly, the node INT is pre-charged to a value which is close to the switching threshold of the inverter 34. If the node MAT crosses the node REF, the node INT requires only a few tens of millivolts to allow the switching of the inverter 34. The loop formed by the transistors 36, 37 and 38 allows limitation of the speed with which the node INT is pre-charged. This is done to avoid anomalies on the output of the comparator. The transistors 37 and 38 are P-channel MOS transistors and the transistor 36 is of the N-channel type.

In particular, the MOS transistor 37 is diode configured and is connected between the supply voltage Vdd and the transistor 36 is connected to ground. The gate terminal of the transistor 38 is connected to the gate terminal of the transistor 37 and is series-connected to the transistor 35. Transistor 35 is in a feedback loop between the output and the input of the inverter 34.

The read amplifier circuit according to the present invention allows discrimination of very low currents with fast output switching. The circuit is susceptible to numerous modifications and variations, all of which are within the scope of the invention. All the details may furthermore be replaced with other technically equivalent elements. Incorporated herein by reference in its entirety is Italian Patent Application No. MI99A002119, from which this application claims priority, and is assigned to the asignee of the present invention.

That which is claimed is:

1. A memory read amplifier charge amplifier circuit comprising:
    at least one memory cell to be read and a bit line connected thereto;
    a first pre-charge amplifier circuit connected to said bit line;
    a first cascode circuit connected between a supply voltage and said at least one memory cell for providing a first current to said at least one memory cell, said first cascode circuit comprising at least one transistor including at least one control terminal connected to said first pre-charged amplifier circuit;
    at least one reference memory cell and a reference bit line connected thereto;
    a second pre-charge amplifier circuit connected to said reference bit line;
    a second cascode circuit connected between the supply voltage and said at least one reference memory cell for providing a second current to said at least one reference memory cell, said second cascode circuit comprising at least one transistor including at least one control terminal connected to said second pre-charge amplifier circuit; and
    a differential comparator circuit having a first input connected to the at least one control terminal of said first cascode circuit for receiving a first voltage based upon the first current, and a second input connected to the at least one control terminal of said second cascode circuit for receiving a second voltage based upon the second current, said differential comparator circuit for comparing the first and second voltages for providing a logic value related to a state of said at least one memory cell to be read.

2. A read amplifier circuit according to claim 1, wherein said first pre-charge amplifier circuit comprises a first N-channel MOS transistor, a first P-channel MOS transistor connected to said first N-channel MOS transistor for biasing thereof, and a second P-channel MOS transistor connected to said first P-channel MOS transistor for switching off said first pre-charge amplifier circuit; and wherein said second pre-charge amplifier circuit comprises a first N-channel MOS transistor, a first P-channel MOS transistor connected to said first N-channel MOS transistor for biasing thereof, and a second P-channel MOS transistor connected to said first P-channel MOS transistor for switching off said second pre-charge amplifier circuit.

3. A read amplifier circuit according to claim 2, wherein said first N-channel MOS transistor and said first P-channel MOS transistor of said first pre-charge amplifier circuit each comprises a drain connected together and to the at least one control terminal of said first cascode circuit; and wherein said first N-channel MOS transistor and said first P-channel MOS transistor of said second pre-charge amplifier circuit each comprises a drain connected together and to the at least one control terminal of said second cascode circuit.

4. A read amplifier circuit according to claim 2, wherein said at least one transistor of said first cascode circuit comprises a native N-channel MOS transistor comprising a source connected to said at least one memory cell, and a P-channel MOS transistor connected between a drain of said native N-channel MOS transistor and the supply voltage; and wherein said at least one transistor of said second cascode circuit comprises a native N-channel MOS transistor comprising a source connected to said at least one reference memory cell, and a P-channel MOS transistor connected between a drain of said native N-channel MOS transistor and the supply voltage.

5. A read amplifier circuit according to claim 4, wherein said P-channel MOS transistor of said first cascode circuit comprises a gate connected to a gate of said second P-channel MOS transistor of said first pre-charge-amplifier circuit; and wherein said P-channel MOS transistor of said second cascode circuit comprises a gate connected to a gate of said second P-channel MOS transistor of said second pre-charge amplifier circuit.

6. A read amplifier circuit according to claim 4, wherein said first P-channel MOS transistor of said first pre-charge circuit comprises a drain connected to a gate of said native N-channel MOS transistor; and wherein said first P-channel MOS transistor of said second pre-charge circuit comprises a drain connected to a gate of said native N-channel MOS transistor.

7. A read amplifier circuit according to claim 1, wherein said differential comparator circuit comprises:
- an inverter;
- a differential pair of transistors connected to said inverter; and
- a pre-charge circuit connected to said inverter for pre-charging an output of said differential pair of transistors to a value close to a switching threshold of said inverter.

8. A read amplifier circuit according to claim 7, wherein said pre-charge circuit comprises a feedback transistor connected across an input and an output of said inverter.

9. A read amplifier circuit according to claim 8, further comprising a loop circuit connected to said feedback transistor for limiting a pre-charging speed of the output of said differential pair of transistors.

10. A read amplifier circuit according to claim 9, wherein said loop circuit comprises a first P-channel MOS transistor and an N-channel MOS transistor connected in series between the supply voltage and a second voltage reference, and wherein said first P-channel MOS transistor comprises a gate and a drain connected together.

11. A read amplifier circuit according to claim 10, wherein said loop circuit further comprises a second P-channel MOS transistor connected between the supply voltage and said feedback transistor, said second P-channel MOS transistor comprising a gate connected to a gate of said first P-channel MOS transistor.

12. A memory read amplifier circuit comprising:
- at least one memory cell to be read and a bit line connected thereto;
- a first pre-charge amplifier circuit connected to said bit line;
- a first circuit connected between a supply voltage and said at least one memory cell for providing a first current to said at least one memory cell, said first circuit comprising at least one transistor including at least one control terminal connected to said first pre-charge amplifier circuit;
- at least one reference memory cell and a reference bit line connected thereto;
- a second pre-charge amplifier circuit connected to said reference bit line;
- a second circuit connected between the supply voltage and said at least one reference memory cell for providing a second current to said at least one reference memory cell, said second circuit comprising at least one transistor including at least one control terminal connected to said second pre-charge amplifier circuit, at least one of said first and second circuits comprising a cascode circuit; and
- a differential comparator circuit having a first input connected to the at least one control terminal of said first circuit for receiving a first voltage based upon the first current, and a second input connected to the at least one control terminal of said second circuit for receiving a second voltage based upon the second current, said differential comparator circuit for comparing the first and second voltages for providing a logic value related to a state of said at least one memory cell to be read.

13. A read amplifier circuit according to claim 12, wherein said first pre-charge amplifier circuit comprises a first N-channel MOS transistor, a first P-channel MOS transistor connected to said first N-channel MOS transistor for biasing thereof, and a second P-channel MOS transistor connected to said first P-channel MOS transistor for switching off said first pre-charge amplifier circuit; and wherein said second pre-charge amplifier circuit comprises a first N-channel MOS transistor, a first P-channel MOS transistor connected to said first N-channel MOS transistor for biasing thereof, and a second P-channel MOS transistor connected to said first P-channel MOS transistor for switching off said second pre-charge amplifier circuit.

14. A read amplifier circuit according to claim 13, wherein said first N-channel MOS transistor and said first P-channel MOS transistor of said first pre-charge amplifier circuit each comprises a drain connected together and to the at least one control terminal of said first circuit; and wherein said first N-channel MOS transistor and said first P-channel MOS transistor of said second pre-charge amplifier circuit each comprises a drain connected together and to the at least one control terminal of said second circuit.

15. A read amplifier circuit according to claim 13, wherein said at least one transistor of said first circuit comprises a native N-channel MOS transistor comprising a source connected to said at least one memory cell, and a P-channel MOS transistor connected between a drain of said native N-channel MOS transistor and the supply voltage; and wherein said at least one transistor of said second circuit comprises a native N-channel MOS transistor comprising a source connected to said at least one reference memory cell, and a P-channel MOS transistor connected between a drain of said native N-channel MOS transistor and the supply voltage.

16. A read amplifier circuit according to claim 15, wherein said P-channel MOS transistor of said first circuit comprises a gate connected to a gate of said second P-channel MOS transistor of said first pre-charge-amplifier circuit; and wherein said P-channel MOS transistor of said second circuit comprises a gate connected to a gate of said second P-channel MOS transistor of said second pre-charge amplifier circuit.

17. A read amplifier circuit according to claim 12, wherein said differential comparator circuit comprises:
- an inverter;
- a differential pair of transistors connected to said inverter; and
- a pre-charge circuit connected to said inverter for pre-charging an output of said differential pair of transistors to a value close to a switching threshold of said inverter.

18. A read amplifier circuit according to claim 17, wherein said pre-charge circuit comprises a feedback transistor connected across an input and an output of said inverter.

19. A read amplifier circuit according to claim 18, further comprising a loop circuit connected to said feedback transistor for limiting a pre-charging speed of the output of said differential pair of transistors.

20. A read amplifier circuit according to claim 19, wherein said loop circuit comprises a first P-channel MOS transistor and an N-channel MOS transistor connected in series between the supply voltage and a second voltage reference, and wherein said first P-channel MOS transistor comprises a gate and a drain connected together.

21. A read amplifier circuit according to claim 20, wherein said loop circuit further comprises a second P-channel MOS transistor connected between the supply voltage and said feedback transistor, said second P-channel MOS transistor comprising a gate connected to a gate of said first P-channel MOS transistor.

22. A memory device comprising:
- at least one memory cell and a bit line connected thereto;
- at least one reference memory cell and a reference bit line connected thereto;
- a read amplifier circuit connected to said at least one memory cell and said at least one reference memory cell for reading said at least one memory cell, said read amplifier circuit comprising
  - a first pre-charge amplifier circuit connected to said bit line,
  - a first cascode circuit connected between a supply voltage and said at least one memory cell for providing a first current to said at least one memory cell, said first cascode circuit comprising at least one transistor including at least one control terminal connected to said first pre-charge amplifier circuit,
  - a second pre-charge amplifier circuit connected to said reference bit line,
  - a second cascode circuit connected between the supply voltage and said at least one reference memory cell for providing a second current to said at least one reference memory cell, said second cascode circuit comprising at least one transistor including at least one control terminal connected to said second pre-charge amplifier circuit, and
  - a differential comparator circuit having a first input connected to the at least one control terminal of said first cascode circuit for receiving a first voltage based upon the first current, and a second input connected to the at least one control terminal of said second cascode circuit for receiving a second voltage based upon the second current, said differential comparator circuit for comparing the first and second voltages for providing a logic value related to a state of said at least one memory cell to be read.

23. A memory device according to claim 22, wherein said first pre-charge amplifier circuit comprises a first N-channel MOS transistor, a first P-channel MOS transistor connected to said first N-channel MOS transistor for biasing thereof, and a second P-channel MOS transistor connected to said first P-channel MOS transistor for switching off said first pre-charge amplifier circuit; and wherein said second pre-charge amplifier circuit comprises a first N-channel MOS transistor, a first P-channel MOS transistor connected to said first N-channel MOS transistor for biasing thereof, and a second P-channel MOS transistor connected to said first P-channel MOS transistor for switching off said second pre-charge amplifier circuit.

24. A memory device according to claim 23, wherein said first N-channel MOS transistor and said first P-channel MOS transistor of said first pre-charge amplifier circuit each comprises a drain connected together and to the at least one control terminal of said first cascode circuit; and wherein said first N-channel MOS transistor and said first P-channel MOS transistor of said second pre-charge amplifier circuit each comprises a drain connected together and to the at least one control terminal of said second cascode circuit.

25. A memory device according to claim 23, wherein said at least one transistor of said first cascode circuit comprises a native N-channel MOS transistor comprising a source connected to said at least one memory cell, and a P-channel MOS transistor connected between a drain of said native N-channel MOS transistor and the supply voltage; and wherein said at least one transistor of said second cascode circuit comprises a native N-channel MOS transistor comprising a source connected to said at least one reference memory cell, and a P-channel MOS transistor connected between a drain of said native N-channel MOS transistor and the supply voltage.

26. A memory device according to claim 25, wherein said P-channel MOS transistor of said first cascode circuit comprises a gate connected to a gate of said second P-channel MOS transistor of said first pre-charge-amplifier circuit; and wherein said P-channel MOS transistor of said second cascode circuit comprises a gate connected to a gate of said second P-channel MOS transistor of said second pre-charge amplifier circuit.

27. A memory device according to claim 25, wherein said first P-channel MOS transistor of said first pre-charge circuit comprises a drain connected to a gate of said native N-channel MOS transistor; and wherein said first P-channel MOS transistor of said second pre-charge circuit comprises a drain connected to a gate of said native N-channel MOS transistor.

28. A memory device according to claim 22, wherein said differential comparator circuit comprises:
- an inverter;
- a differential pair of transistors connected to said inverter; and
- a circuit pre-charge connected to said inverter for pre-charging an output of said differential pair of transistors to a value close to a switching threshold of said inverter.

29. A memory device according to claim 28, wherein said pre-charge circuit comprises a feedback transistor connected across an input and an output of said inverter.

30. A memory device according to claim 29, further comprising a loop circuit connected to said feedback transistor for limiting a pre-charging speed of the output of said differential pair of transistors.

31. A memory device according to claim 30, wherein said loop circuit comprises a first P-channel MOS transistor and an N-channel MOS transistor connected in series between the supply voltage and a second voltage reference, and wherein said first P-channel MOS transistor comprises a gate and a drain connected together.

32. A memory device according to claim 31, wherein said loop circuit further comprises a second P-channel MOS transistor connected between the supply voltage and said feedback transistor, said second P-channel MOS transistor comprising a gate connected to a gate of said first P-channel MOS transistor.

33. A memory device according to claim 22, wherein said memory device is a EEPROM device.

34. A method for reading a memory device comprising at least one memory cell to be read and a bit line connected thereto, a first pre-charge amplifier circuit connected to the bit line, at least one reference memory cell and a reference bit line connected thereto, and a second pre-charge amplifier circuit connected to the reference bit line, the method comprising:
- providing a first current to the at least one memory cell using a first cascode circuit connected between a supply voltage and the at least one memory cell, the first cascode circuit comprising at least one transistor including at least one control terminal connected to the first pre-charge amplifier circuit;
- providing a second current to the at least one reference memory cell using a second cascode circuit connected between the supply voltage and the at least one reference memory cell, the second cascode circuit comprising at least one transistor including at least one control terminal connected to the second pre-charge amplifier circuit;

converting the first current to a first voltage and providing the first voltage to a first input of a differential comparator circuit connected to the at least one control terminal of the first cascode circuit;

converting the second current to a second voltage and providing the second voltage to a second input of the differential comparator circuit connected to the at least one control terminal of the second cascode circuit; and comparing the first and second voltages for providing a logic value related to a state of the at least one memory cell to be read.

35. A method according to claim 34, wherein the first pre-charge amplifier circuit comprises a first N-channel MOS transistor, a first P-channel MOS transistor connected to the first N-channel MOS transistor for biasing thereof, and a second P-channel MOS transistor connected to the first P-channel MOS transistor for switching off the first pre-charge amplifier circuit; and wherein the second pre-charge amplifier circuit comprises a first N-channel MOS transistor, a first P-channel MOS transistor connected to the first N-channel MOS transistor for biasing thereof, and a second P-channel MOS transistor connected to the first P-channel MOS transistor for switching off the second pre-charge amplifier circuit.

36. A method according to claim 35, wherein the first N-channel MOS transistor and the first P-channel MOS transistor of the first pre-charge amplifier circuit each comprises a drain connected together and to the at least one control terminal of the first cascode circuit; and wherein the first N-channel MOS transistor and the first P-channel MOS transistor of the second pre-charge amplifier circuit each comprises a drain connected together and to the at least one control terminal of the second cascode circuit.

37. A method according to claim 35, wherein the at least one transistor of the first cascode circuit comprises a native N-channel MOS transistor comprising a source connected to the at least one memory cell, and a P-channel MOS transistor connected between a drain of the native N-channel MOS transistor and the supply voltage; and wherein the at least one transistor of the second cascode circuit comprises a native N-channel MOS transistor comprising a source connected to the at least one reference memory cell, and a P-channel MOS transistor connected between a drain of the native N-channel MOS transistor and the supply voltage.

38. A method according to claim 37, wherein the P-channel MOS transistor of the first cascode circuit comprises a gate connected to a gate of the second P-channel MOS transistor of the first pre-charge amplifier circuit; and wherein the P-channel MOS transistor of the second cascode circuit comprises a gate connected to a gate of the second P-channel MOS transistor of the second pre-charge amplifier circuit.

* * * * *

UNITED STATES PATENT AND TRADEMARK OFFICE
CERTIFICATE OF CORRECTION

PATENT NO. : 6,320,808 B1
DATED : November 20, 2001
INVENTOR(S) : Antonino Conte and Maurizio Gaibotti It is certified that error appears in the above-identified patent and that said Letters Patent is hereby corrected as shown below:

<u>Column 5,</u>
Line 56, delete "read amplifier charge amplifier circuit" insert -- read amplifier circuit --

Signed and Sealed this

Twenty-first Day of May, 2002

Attest:

JAMES E. ROGAN
*Director of the United States Patent and Trademark Office*

*Attesting Officer*